United States Patent
Graham et al.

(10) Patent No.: US 7,709,827 B2
(45) Date of Patent: May 4, 2010

(54) VERTICALLY INTEGRATED FIELD-EFFECT TRANSISTOR HAVING A NANOSTRUCTURE THEREIN

(75) Inventors: Andrew Graham, München (DE); Franz Hofmann, München (DE); Wolfgang Hönlein, Unterhaching (DE); Johannes Kretz, München (DE); Franz Kreupl, München (DE); Erhard Landgraf, München (DE); Johannes Richard Luyken, München (DE); Wolfgang Rösner, Ottobrunn, DE (US); Thomas Schulz, Austin, TX (US); Michael Specht, München (DE)

(73) Assignee: Qimonda, AG, Munich (DE)

( * ) Notice: Subject to any disclaimer, the term of this patent is extended or adjusted under 35 U.S.C. 154(b) by 0 days.

(21) Appl. No.: 10/533,550

(22) PCT Filed: Oct. 29, 2003

(86) PCT No.: PCT/DE03/03587

§ 371 (c)(1),
(2), (4) Date: Nov. 17, 2005

(87) PCT Pub. No.: WO2004/040666

PCT Pub. Date: May 13, 2004

(65) Prior Publication Data
US 2006/0128088 A1    Jun. 15, 2006

(30) Foreign Application Priority Data
Oct. 31, 2002  (DE)  ................... 102 50 868

(51) Int. Cl.
*H01L 21/8238* (2006.01)
(52) U.S. Cl. ........................ 257/24; 438/202

(58) Field of Classification Search .............. 438/763, 438/761, 758, 202; 257/24
See application file for complete search history.

(56) References Cited

U.S. PATENT DOCUMENTS 4,757,029 A * 7/1988 Koury, Jr. ................ 438/269

(Continued)

FOREIGN PATENT DOCUMENTS

DE           100 36 897         1/2002

(Continued)

OTHER PUBLICATIONS

Choi, Won Bong et al., "Ultrahigh-Density Nanotransistors by Using Selective Grown Vertical Carbon Nanotubes," American Institute of Physics, Applied Physics Letters, vol. 79, No. 22, pp. 3696-3698, (Nov. 26, 2001).

(Continued)

*Primary Examiner*—Thao P. Le
(74) *Attorney, Agent, or Firm*—Dicke, Billig & Czaja, PLLC

(57) ABSTRACT

The invention relates to a vertical integrated component, a component arrangement and a method for production of a vertical integrated component. The vertical integrated component has a first electrical conducting layer, a mid layer, partly embodied from dielectric material on the first electrical conducting layer, a second electrical conducting layer on the mid layer and a nanostructure integrated in a through hold introduced in the mid layer. A first end section of the nanostructure is coupled to the first electrical conducting layer and a second end section is coupled to the second electrical conducting layer. The mid layer includes a third electrical conducting layer between two adjacent dielectric partial layers, the thickness of which is less than the thickness of at least one of the dielectric partial layers.

20 Claims, 4 Drawing Sheets

U.S. PATENT DOCUMENTS

| | | | | |
|---|---|---|---|---|
| 4,903,089 A | * | 2/1990 | Hollis et al. | 257/256 |
| 5,106,778 A | * | 4/1992 | Hollis et al. | 438/173 |
| 5,286,674 A | * | 2/1994 | Roth et al. | 438/624 |
| 5,308,778 A | * | 5/1994 | Fitch et al. | 438/128 |
| 5,362,972 A | * | 11/1994 | Yazawa et al. | 257/13 |
| 5,398,200 A | * | 3/1995 | Mazure et al. | 365/174 |
| 5,612,563 A | * | 3/1997 | Fitch et al. | 257/329 |
| 6,515,325 B1 | * | 2/2003 | Farnworth et al. | 257/296 |
| 6,566,704 B2 | * | 5/2003 | Choi et al. | 257/314 |
| 2001/0019279 A1 | * | 9/2001 | Martin et al. | 326/26 |
| 2001/0023986 A1 | * | 9/2001 | Mancevski | 257/741 |
| 2002/0001905 A1 | * | 1/2002 | Choi et al. | 438/268 |
| 2002/0130333 A1 | * | 9/2002 | Watanabe et al. | 257/200 |
| 2003/0214699 A1 | * | 11/2003 | Banin et al. | 359/333 |

FOREIGN PATENT DOCUMENTS

| | | |
|---|---|---|
| EP | 0 452 950 | 10/1991 |
| WO | WO 01/57917 | 8/2001 |
| WO | WO 01/61753 | 8/2001 |
| WO | WO 03/026034 | 3/2003 |

OTHER PUBLICATIONS

Derycke, V. et al, "Carbon Nanotube Inter- and Intramolecular Logic Gates," American Chemical Society, Nano Letters, vol. 1, No. 9, pp. 453-456, (Nov. 26, 2001).

Harris, Peter J. F., "Carbon Nanotubes and Related Structures," Cambridge University Press, pp. 1-15 and 111-155 (1999).

Huang, Yu et al., "Logic Gates and Computation from Assembled Nanowire Building Blocks," Science, vol. 294, pp. 1313-1317, (Nov. 9, 2001).

Johnson, Justin C. et al., "Single Nanowire Lasers," J. Phys. Chem. B, pp. Est. 3-6, (Nov. 26, 2001).

* cited by examiner

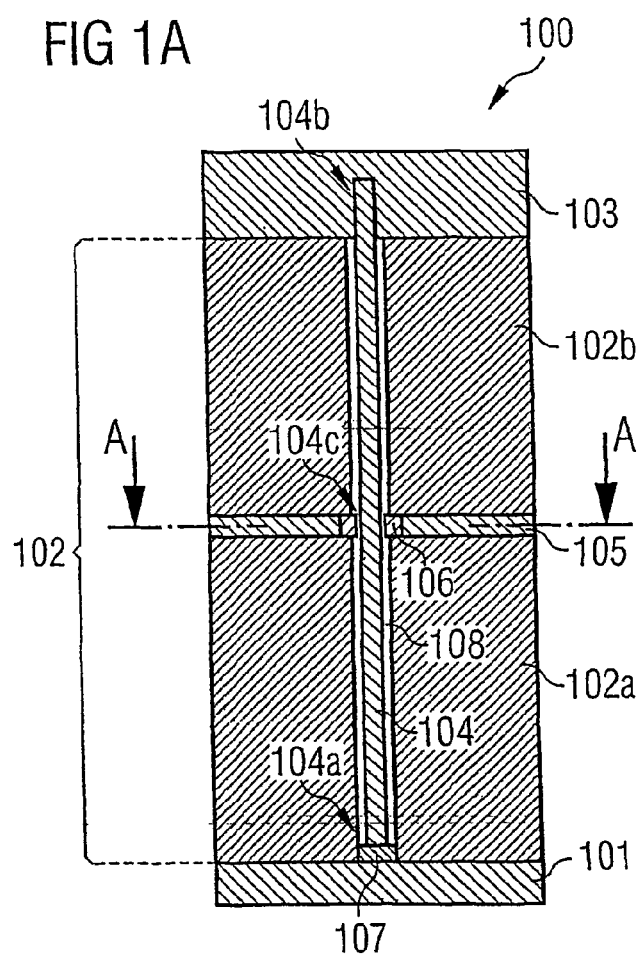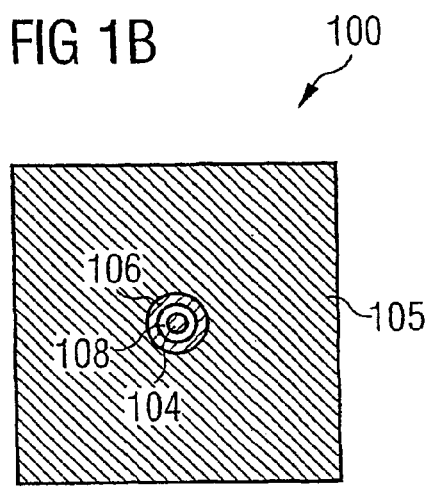

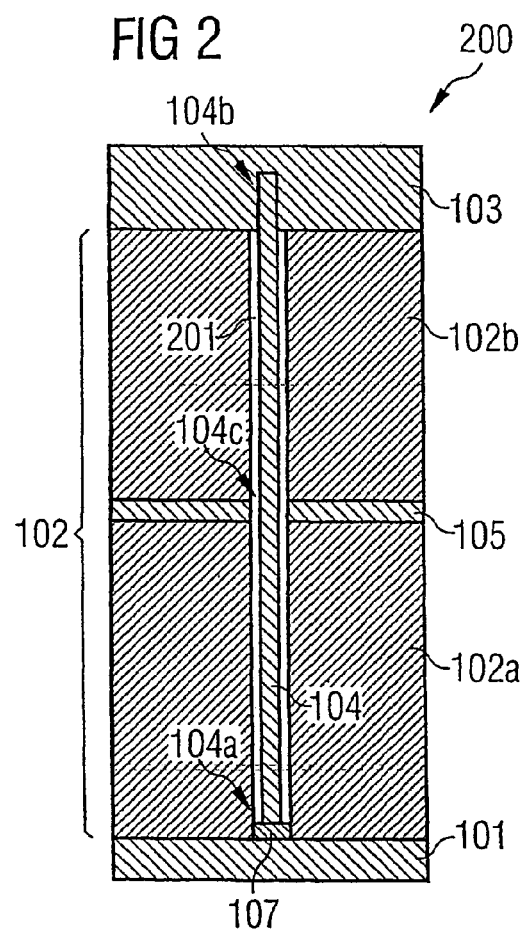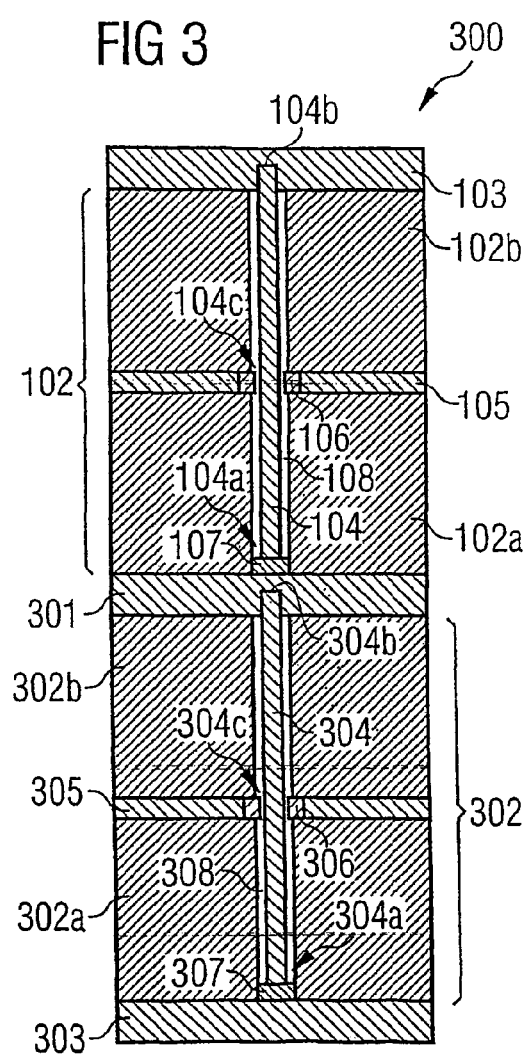

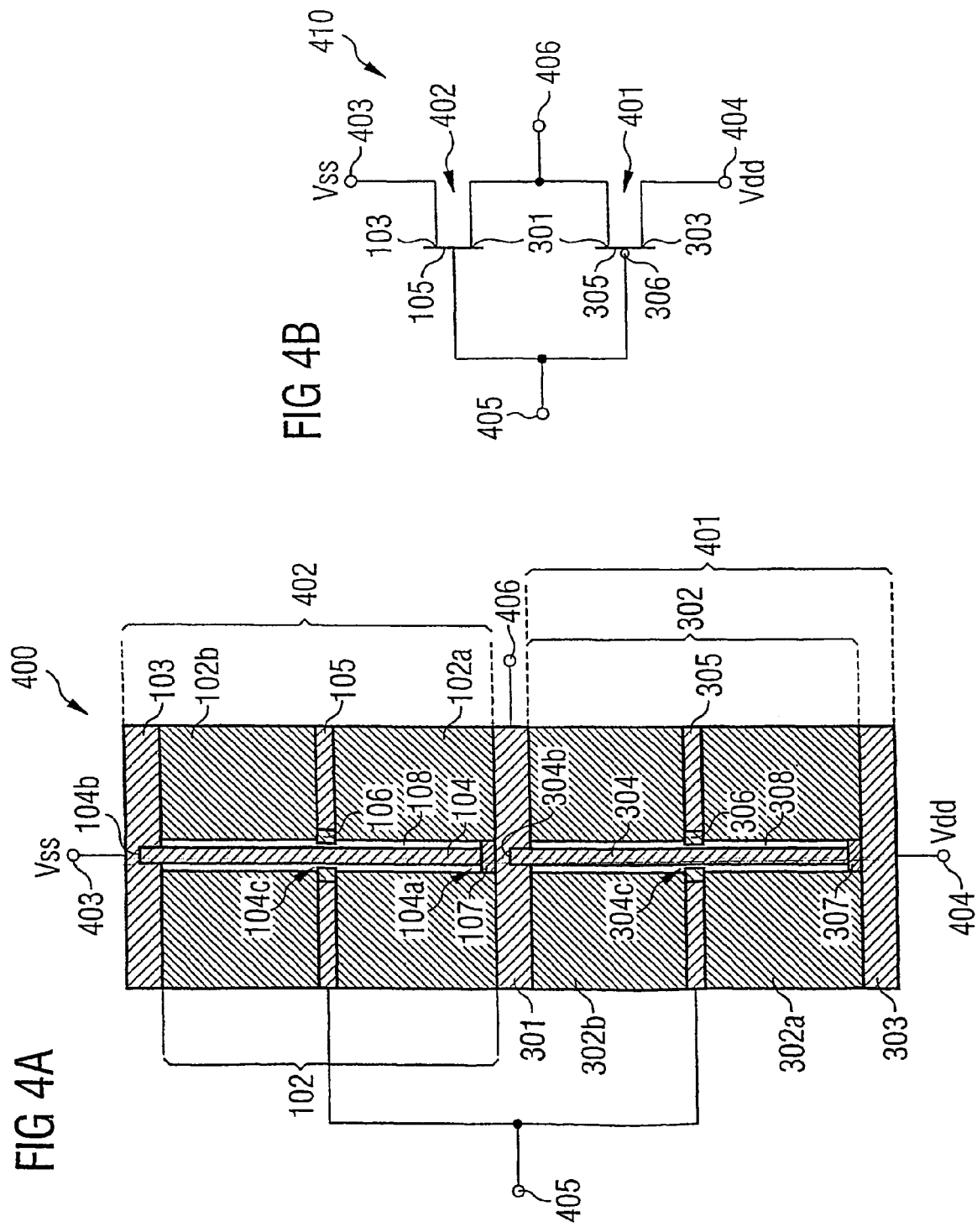

VERTICALLY INTEGRATED FIELD-EFFECT
TRANSISTOR HAVING A NANOSTRUCTURE
THEREIN

CROSS REFERENCE TO RELATED APPLICATION

This Utility Patent Application claims the benefit of the filing date of German Application No. DE 102 50 868.2, filed Oct. 31, 2002, and International Application No. PCT/DE03/003587, filed Oct. 29, 2003, both of which are herein incorporated by reference.

BACKGROUND

The invention relates to a vertically integrated component, to a component array and to a method for fabricating a vertically integrated component.

With ongoing miniaturization, conventional silicon microelectronics will reach its limits. In particular, the development of increasingly small and densely arranged transistors of by now several hundred million transistors per chip will be subject to fundamental physical problems and restrictions within the next ten years. When structure sizes drop below approximately 80 nm, the components are disruptively influenced by quantum effects, which are dominant at dimensions of below approximately 30 nm. The increasing integration density of the components on a chip also leads to a dramatic rise in the waste heat.

Nanostructures, such as for example nanotubes, in particular carbon nanotubes, and nanorods, also known as nanowires, are known to be a possible successor technology to conventional semiconductor electronics.

By way of example, Harris, P J F (1999) "Carbon Nanotubes and Related Structures—New Materials for the Twenty-first Century," Cambridge University Press, Cambridge, pp. 1 to 15, 111 to 155 gives an overview of the technology of carbon nanotubes. A carbon nanotube is a single-walled or multiwalled tube-like carbon compound. In the case of multi-walled nanotubes, at least one inner nanotube is coaxially surrounded by an outer nanotube. Single-walled nanotubes typically have diameters of 1 nm, while the length of a nanotube may be several hundred nm. The ends of a nanotube are often terminated by in each case half a fullerene molecule. Nanotubes can be produced by depositing a layer of catalyst material, for example of iron, cobalt or nickel, on a substrate and growing carbon nanotubes on the catalyst material layer using a CVD (chemical vapor deposition) process by introducing a carbon-containing material (for example acetylene) into the process chamber. On account of the good electrical conductivity of carbon nanotubes and on account of the ability to adjust this conductivity, for example by the application of an external electrical field or by doping the nanotubes, for example with potassium, nanotubes are suitable for a wide range of applications, including electrical coupling technology in integrated circuits, for components used in microelectronics and as electron emitters.

Field-effect transistors are required for many integrated components used in silicon microelectronics. A carbon nanotube can be used to form a field-effect transistor of this type, resulting in the formation of what is known as a CNT-FET (carbon nanotube field-effect transistor). For this purpose, by way of example, a nanotube is formed in planar form on a dielectric layer on a conductive substrate and contact-connected. The conductivity of the carbon nanotube is controlled by a suitable electric voltage applied to the conductive substrate, so that the flow of electric current through the nanotube, that is, the flow of electric current between the source/drain terminals of the CNT-FET, can be controlled by applying a voltage to the conductive substrate.

A method for forming a field-effect transistor using a carbon nanotube is described, for example, in Derycke, V, Martel, R, Appenzeller, J, Avouris, P (2001) "Carbon Nanotube Inter- and Intramolecular Logic Gates", Nanoletters 1(9): 453-456, (the "Derycke reference"). According to the method described in the Derycke reference, first of all a silicon dioxide layer is formed on a silicon substrate, and then contact-connection pads are formed on the silicon dioxide layer. Then, a carbon nanotube is applied between two contact-connection pads and contact-connected to the contact-connection pads, it being possible to control the conductivity of the carbon nanotube by applying a voltage to the silicon substrate. The level of the flow of electric current between the two end portions of a carbon nanotube, for a predetermined electric voltage, is dependent on the conductivity of the carbon nanotube and can therefore be controlled by means of the electric voltage at the silicon substrate.

Furthermore, it is known from the Derycke reference to produce a semiconducting carbon nanotube of optionally the p-conduction type or the n-conduction type. When forming a carbon nanotube in the conventional way, the nanotube is often obtained in the p-conduction state. A carbon nanotube of the p-conduction type can be converted into a carbon nanotube of the n-conduction type by conditioning in vacuo or by doping with potassium ions.

However, the method which is known from the Derycke reference has the drawback that it is only possible to fabricate planar, horizontally oriented nanotubes on a substrate. A carbon nanotube field-effect transistor with a nanotube formed horizontally on a substrate, however, has the drawback that a component of this type takes up a large amount of space on the surface of a substrate, and consequently the integration density of components, for example carbon nanotube field-effect transistors, on a substrate is low.

Nanorods, also known as nanowires, are also used as an alternative to nanotubes, for example to carbon nanotubes, as nanostructures for an integrated circuit. By way of example, it is known from Johnson, J C, Yan, H, Schaller, R D, Haber, L H, Saykally, R J, Yang, P (2001) "Single Nanowire Lasers" J. Phys. Chem. B, 105, 11387, 2001,(the "Johnson reference"), to form a tuft of vertical zinc oxide nanowires on a gold catalyst which has been applied to a sapphire substrate. It is in this way possible to produce protruding zinc oxide nanowires with diameters of approximately 40 nm to 150 nm and a density of approximately $10^3$ wires per $cm^2$. According to the concept which is known from the Johnson reference, tufts of zinc oxide nanowires are used as laser components.

Furthermore, it is known from Huang, Y, Duan, X, Cui, Y, Lauhon, L J, Kim, K H, Lieber, C M (2001) "Logic Gates and Computation from Assembled Nanowire Building Blocks," Science 294: 1313-1317, (the "Huang reference"), to produce field-effect transistors and logic gates from horizontal, crossed nanowires of p-doped silicon and n-doped gallium nitride formed on a substrate surface.

However, the nanowires described in the Huang reference are only formed in planar form in the horizontal direction on a substrate surface and contact-connected. Since consequently the dimension of a component obtained is determined by the length of a nanostructure (of the order of magnitude of micrometers), the method which is known from the Huang reference is contradictory to the requirement for ongoing miniaturization.

It is known from DE 100 36 897 C1 to introduce a via hole into a thick gate electrode layer and to grow a vertical nanoelement therein. This results in a vertical field-effect transistor with the nanoelement as channel region, it being possible to control the electrical conductivity of the channel region by means of the gate electrode region which surrounds the nanoelement along approximately its entire longitudinal extent.

US 2002/0001905 A1 discloses a vertical nano-dimensional transistor using carbon nanotubes, and a method for fabricating this transistor.

Choi, W B, Chu, J U, Jeong, K S, Bae, E J, Lee, J W, Kim, J J, Lee, J O (2001) "Ultrahigh-density nanotransistors by using selectively grown vertical carbon nanotubes" Applied Physics Letters, Vol. 79, No. 22, 3696-3698 describes ultrahigh-density nanotransistors using selectively grown vertical carbon nanotubes.

WO 01/61753 A1 discloses an electronic component having an electrically conductive compound formed from carbon nanotubes, and methods for fabricating it.

SUMMARY

One embodiment of the invention increases the integration density of sufficiently accurately controllable components with a nanostructure and provides sensitive nanostructures in such a way that they are protected against mechanical damage. One embodiment includes a vertically integrated component, a component array and a method for fabricating a vertically integrated component.

One embodiment of the invention provides a vertically integrated component having a first electrically conductive layer, a middle layer, formed partially from dielectric material, on the first electrically conductive layer, and a second electrically conductive layer on the middle layer. Furthermore, there is a nanostructure, which is integrated in a via hole introduced into the middle layer and comprises a first end portion that is coupled to the first electrically conductive layer and a second end portion that is coupled to the second electrically conductive layer. Between two adjacent dielectric sublayers, the middle layer has a third electrically conductive layer, the thickness of which is less than the thickness of at least one of the dielectric sublayers.

Furthermore, one embodiment of the invention provides a component array having at least two components having the abovementioned features arranged next to one another and/or having at least two components having the abovementioned features arranged above one another.

According to one method for fabricating one embodiment of the vertically integrated component, a first electrically conductive layer is formed, a middle layer composed partially of dielectric material is formed and a via hole is introduced into the middle layer. Furthermore, a nanostructure having a first end portion and a second end portion is formed in the via hole, the first end portion being coupled to the first electrically conductive layer. A second electrically conductive layer is formed on the middle layer and is coupled to the second end portion of the nanostructure. The middle layer is formed in such a manner that a third electrically conductive layer is formed between two adjacent dielectric sublayers, the thickness of which third electrically conductive layer is less than the thickness of at least one of the dielectric sublayers.

In one embodiment of the invention, the sufficiently thin third electrically conductive layer included in the middle layer can be used to reliably control the electrical conductivity of an adjoining region of the nanostructure. Therefore, the vertically integrated component can be operated as a component which is similar to a field-effect transistor, with the third electrically conductive layer in this case serving as a gate electrode layer, whereas the nanostructure serves as a channel region. Since the third electrically conductive layer is made sufficiently thin in accordance with one embodiment of the invention, when an electric voltage is applied to the third electrically conductive layer a strong electric field is formed in an adjoining region surrounding the nanostructure, in other words the field is concentrated, on account of an electrostatic peak effect. The field effect can be used for very highly accurate control of the electrical conductivity in the region of the nanostructure that adjoins the third electrically conductive layer.

In one embodiment, the geometric position of the third electrically conductive layer within the middle layer can be predetermined by means of a deposition process rather than by means of a lithographic process. With a deposition process (for example ALD, atomic layer deposition), it is possible to set the thickness of a layer with an accuracy of up to one atomic layer, that is, up to a few Ångstrom. The desired position and thickness of the third electrically conductive layer within the middle layer can therefore be very accurately defined in accordance with the invention. Consequently, the channel region of the field-effect transistor can be reliably made to block or conduct selectively in the vertically integrated component according to one embodiment of the invention in its configuration as a field-effect transistor. It is possible to set the operating state that is desired in each case by applying or not applying a voltage to the third electrically conductive layer.

According to one embodiment of the invention, the ability to set the electrical conductivity of the nanotube is improved compared to the prior art by the fact that a spatially accurately defined position of the nanostructure is influenced by means of a spatially localized electric field with a high amplitude, rather than by relatively unspecific, undefined control of the conductivity of approximately an entire nanostructure, as is the case in the prior art.

According to one embodiment of the invention, it is possible to grow one or more vertically arranged nanostructures, for example carbon nanotubes, in a via hole.

The vertically integrated component according to one embodiment of the invention consists in the miniaturization of the component all the way down to the range of nanometer dimensions in the lateral direction, since the surface area required for a vertically integrated component is in principle limited only by the cross-sectional area of the nanostructure. Furthermore, according to one embodiment of the invention the often sensitive nanostructure is introduced in an insulating and protective matrix of the dielectric material of the middle layer. The spatial arrangement of nanostructures of different vertically integrated components of a component array according to the invention can be realized by predetermining a spatial arrangement of via holes in which the nanostructures are grown, so as to allow an ordered array of different nanostructures. Furthermore, there is no need for a crystalline substrate to be present.

The production of nanostructures, for example carbon nanotubes in a vertical contact hole, can be realized at acceptable technology outlay. Furthermore, it is possible to adjust the length of the nanostructure, for example a carbon nanotube, by setting the thickness of the middle layer.

In one embodiment, catalyst material for catalyzing the formation of the nanostructure is arranged between the first conductive layer and the nanostructure. By depositing catalyst material in a spatially defined arrangement, it is possible to spatially predetermine the growth of the nanostructure. The catalyst material can, for example, be deposited in localized form in the via hole; alternatively, it is possible for a layer of catalyst material to be formed between the first electrically conductive layer and the middle layer, or, for certain applications, the first conductive layer can be produced from a material which is such that the first electrically conductive layer can be used as a catalyst for catalyzing the formation of the nanostructure. The first electrically conductive layer can be produced from iron material and can therefore be used as a catalyst for the growth of carbon nanotubes, since carbon nanotubes grow successfully on iron material.

In the component, the third electrically conductive layer can surround the nanostructure in a region around the first or second end portion. In functional terms, the third conductive layer can be split into a first sublayer and a second sublayer, the first sublayer being located in the region of the first conductive layer and the second sublayer being located in the region of the second conductive layer. With the aid of this split third conductive layer it is possible to effect optimum gate control of the Schottky barriers formed at both end contact regions of the nanostructure.

In one embodiment, the controllability of the electrical conductivity of the nanotube is additionally improved by the third electrically conductive layer surrounding the nanostructure in a region around one of the end portions of the nanostructure, at which the latter adjoins the first or second electrically conductive layer. A Schottky barrier is in each case formed between the first electrically conductive layer and the first end portion of the nanostructure and between the second electrically conductive layer and the second end portion of the nanostructure, the Schottky barriers being sensitive to the electrical conductivity of the nanostructure as a function of an electric field which may be applied and being very strongly spatially localized. If the third electrically conductive layer is formed close to the first or second end portion, it is possible to set the electrical conductivity of the nanostructure in a sensitive way by applying an electric voltage to the third electrically conductive layer.

The thickness of the third electrically conductive layer may be less than, and in one case significantly less than, the thickness of both dielectric sublayers. In one embodiment, the thickness ratio between the first or second dielectric sublayer, on the one hand, and the third electrically conductive layer to be at least three, and in one case at least five, and even more, in one case at least ten.

Furthermore, the component according to one embodiment of the invention may be designed as a field-effect transistor, in which component the first end portion of the nanostructure serves as a first source/drain region and the second end portion of the nanostructure serves as a second source/drain region, and in which component a ring structure formed from an electrically insulating material as gate-insulating region of the field-effect transistor is arranged in the third electrically conductive layer, which serves as gate electrode of the field-effect transistor, along the via hole that has been introduced into the third electrically conductive layer.

In this case, the electrical conductivity of the nanostructure can be controlled by the application of a suitable electrical potential to the third electrically conductive layer, since an electrical potential of this type has a characteristic influence on the electrical conductivity of the nanotube on account of the field effect, and consequently in this region the nanotube can be used as channel region of a field-effect transistor. On account of the ring-like structure of the gate-insulating layer, the electric field which is generated on account of the electrical potential of the third electrically conductive layer acts sufficiently well over the nanostructure, which is attributable to the gate electrode, which is electrically insulated by means of the gate-insulating layer, being surrounded on all sides.

Furthermore, the middle layer may have an additional electrically conductive layer, which at least one additional electrically conductive layer serves as an additional gate electrode of the field-effect transistor, with an additional ring structure formed from an electrically insulating material as an additional gate-insulating region of the field-effect transistor being arranged along the via hole that has been introduced in the additional electrically conductive layer.

In other words, the component configured as a field-effect transistor may have one additional or a plurality of additional gate terminals, thereby further improving the controllability of the electrical resistance of the nanostructure. The possibility of providing additional electrically conductive middle layers as additional gate terminals is substantially based on the fact that the electrically conductive layer or layers in the middle layer are sufficiently thin.

Furthermore, the component according to one embodiment of the invention may have an additional field-effect transistor, which is arranged above the field-effect transistor.

This means that a plurality of field-effect transistors can be arranged above one another in the manner described, in principle in any desired number of layers. This results in a vertical stacked layer of field-effect transistors, allowing more complex circuits, such as for example logic gates, to be formed in a vertically integrated manner. It should be noted that the connection of the component according to one embodiment of the invention in a plurality of layers arranged above one another is not restricted to the application of a field-effect transistor. It is possible for components in accordance with various configurations of the invention to be arranged above one another in order to construct more complex circuits. This realizes a three-dimensional arrangement of the components and increases the integration density of components, based on the surface area of a substrate.

In terms of the configuration of the component according to one embodiment of the invention as a field-effect transistor, it should also be noted that critical parameters, such as for example the gate length of a field-effect transistor of this type, according to one embodiment of the invention are defined not by means of a patterning process, but rather by means of a deposition process. A deposition process can achieve a significantly higher structural accuracy than a patterning process. By way of example, the thickness of a deposited layer can be set to the dimension of one atomic layer, that is, to an accuracy of a few angstrom, using the ALD (atomic layer deposition) process.

The field-effect transistor and the additional field-effect transistor of the component according to one embodiment of the invention can be connected to one another as an inverter circuit.

In such a situation, the field-effect transistor and the additional field-effect transistor are designed as transistors with different conduction types, for example the field-effect transistor as a transistor of the p-conduction type and the additional field-effect transistor as a transistor of the n-conduction type, or vice versa.

The first and/or second electrically conductive layer of the component may include tantalum, tantalum nitride (TaN), titanium, titanium nitride (TiN), molybdenum (Mo), aluminum (Al) and/or a ferromagnetic material, or any desired layer stack may be formed from a combination of the materials indicated above.

If the first and/or second electrically conductive layer is formed from ferromagnetic material, such as for example iron, cobalt or nickel, or from a suitable ferromagnetic alloy, for example from a hard-magnetic or soft-magnetic material, the component can be used for "spintronics" applications. In the technological field of spintronics, semiconductor technology is combined with magnetic effects. In other words, in spintronics, the spin of the electron is used in addition or as an alternative to the electron charge during current transport. According to one embodiment of the invention, applications in spintronics are advantageous if the nanostructure is in the form of a carbon nanotube, since the charge transport through a carbon nanotube is spin-retaining, that is, takes place without a spin flip, over sufficiently large dimensions. One example of a possible application area for the component according to one embodiment of the invention having ferromagnetic first and second electrically conductive layers is an MRAM (magnetic random access memory) memory cell. For this purpose, it is often advantageous to form either the first or the second electrically conductive layer from a hard-magnetic ferromagnetic material and to form the other layer in each case from a soft-magnetic ferromagnetic material.

If the vertically integrated component according to one embodiment of the invention is in the form of a field-effect transistor, this transistor may be designed, for example, as a switching transistor of a DRAM memory cell, in which case a further stacked capacitor is to be formed. It is also possible to realize a memory cell in which the gate-insulating layer of the field-effect transistor is designed as a charge storage layer (e.g. as an ONO layer), in which case information is written and erased by injecting electrons or holes in the charge storage layer.

In one embodiment, the third and/or the additional electrically conductive layer includes polysilicon, tantalum, titanium, niobium and/or aluminum.

The dielectric material of the middle layer may be one or a combination of the materials silicon dioxide ($SiO_2$), silicon nitride ($Si_3N_4$) or silicon dioxide doped with potassium ions.

In one embodiment, silicon dioxide doped with potassium ions has the advantage that potassium ions can be expelled from a dielectric layer of this type by heating and can therefore be used as a dopant for a surrounding material.

The nanostructure may be a nanotube, a bundle of nanotubes or a nanorod (also known as a nanowire).

For example, the nanostructure may be semiconducting.

In one embodiment, the nanorod may include silicon, germanium, indium phosphide, gallium nitride, gallium arsenide, zirconium oxide and/or a metal.

The nanotube may be a carbon nanotube, a carbon-boron nanotube, a carbon-nitrogen nanotube, a carbon-boron-nitrogen nanotube, a tungsten sulfide nanotube or a chalcogenide nanotube.

If the nanostructure is a carbon nanotube, the catalyst material used may be iron, cobalt and/or nickel. If the nanostructure is a gallium arsenide nanorod, the catalyst material used is in one case gold.

The subregion of the via hole which does not have the nanostructure in it may be at least partially filled with an electrically insulating spacer structure.

This ensures that the nanostructure is protected against mechanical or electrical damage in the via hole.

The component may be formed exclusively from dielectric material, metallic material and the material of the nanostructure. Furthermore, the component may be formed on and/or in a substrate of polycrystalline or amorphous material.

In other words, the component according to one embodiment of the invention may consist only of electrically conductive material, dielectric material and material of the nanostructure (in one case a carbon nanotube). In this case, the component can be produced without the need for expensive semiconductor technology processes. Furthermore, a polycrystalline or amorphous material, that is, a material which is not in single-crystal form, can be used as substrate for fabrication of the component. This avoids the need for an expensive, single-crystal substrate (for example a silicon wafer) during fabrication of the component. According to one embodiment of the invention, in principle any desired starting substrate (e.g. glass) can be used.

It should be noted that the configurations which are described above with reference to the component according to the invention also apply to the component array according to the invention and/or to the method for fabricating a vertically integrated component.

Furthermore, in the method for fabricating a vertically integrated component, the middle layer, which may include dielectric sublayers and additional conductive layers (for example of polysilicon, tantalum, titanium, niobium, aluminum), can be deposited on an electrically conductive layer (for example a metal layer, for example a tantalum, tantalum nitride, titanium or titanium nitride layer), which may optionally already have been patterned. A vertical via hole with a typical diameter of between 0.4 nm and 100 nm and with a typical length of between 0.01 µm and 3 µm can be introduced into the middle layer using a lithography process and an etching process. In this method step, the dielectric and electrically conductive sublayers of the middle layer are patterned. It should be noted that the lateral dimension of the via hole can be reduced further by sublithographic narrowing of the mask. The third electrically conductive layer with the via hole passing through it is subsequently oxidized along the periphery of the via hole, for example a third electrically conductive layer produced from polysilicon material can be oxidized, so as to form electrically insulating silicon dioxide material in a region of the third electrically conductive layer which surrounds the via hole, which silicon dioxide material can be used as gate-insulating layer.

According to an alternative configuration of the invention, a gate-insulating layer in ring form is formed using the CVD (chemical vapor deposition) process or the ALD (atomic layer deposition) process by the via hole being uniformly coated with an electrically insulating wall layer. Then, the nanostructure can be formed in the via hole, for example a carbon nanotube is grown on a catalyst material that has been deposited on the first electrically conductive layer. The catalyst material may either be deposited as a layer on the first electrically conductive layer or deposited in the via hole after the gate-insulating layer has been formed on the surface of the first electrically conductive layer using the electroless deposition process. After the nanostructure has been formed, an intermediate region between the via hole and the nanostructure can be sealed, for example by the introduction of silicon dioxide material in at least part of the via hole using a CVD or spin-on process. Excess material can be etched back if appropriate in order to uncover the nanostructure once again, and the second electrically conductive layer can be formed on the surface of the layer sequence and patterned if appropriate.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description.

The elements of the drawings are not necessarily to scale relative to each other. Like reference numerals designate corresponding similar parts.

FIG. 1A illustrates a cross-sectional view through a component in accordance with one embodiment of the invention.

FIG. 1B illustrates an enlarged cross-sectional view, taken on section line A-A from FIG. 1A, of the component illustrated FIG. 1A in accordance with one embodiment of the invention.

FIG. 2 illustrates a cross-sectional view through a component in accordance with an alternative embodiment of the invention.

FIG. 3 illustrates a component array in accordance with one exemplary embodiment of the invention.

FIG. 4A illustrates a cross-sectional view through a component array in accordance with an alternative embodiment of the invention.

FIG. 4B illustrates an equivalent circuit diagram for the component array in accordance with an alternative embodiment of the invention in FIG. 4A.

DETAILED DESCRIPTION

Figure 5:
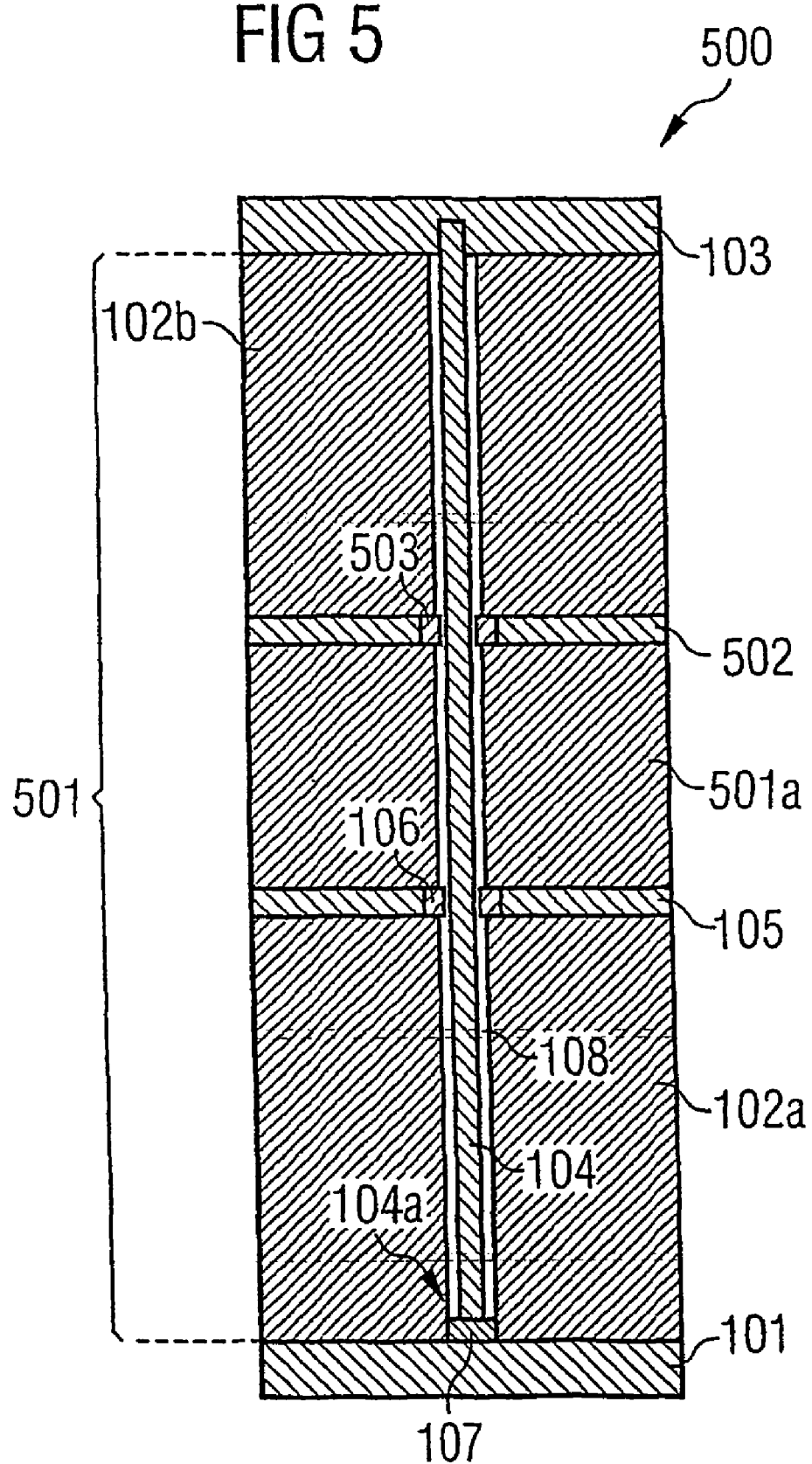
FIG. 5 illustrates a cross-sectional view through a component in accordance with an alternative embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The following text, referring to FIG. 1A, FIG. 1B, describes a vertically integrated component 100 in accordance with one embodiment of the invention.

The vertically integrated component 100 illustrated in FIG. 1A has a first electrically conductive layer 101, a middle layer 102, formed partially from dielectric material, on the first electrically conductive layer 101, and a third electrically conductive layer 105 on the middle layer 102. Furthermore, there is a carbon nanotube 104 which has been integrated in a via hole 108 introduced into the middle layer 102 and includes a first end portion 104a, which is coupled to the electrically conductive layer 101, and a second end portion 104b, which is coupled to the second electrically conductive layer 103.

Catalyst material 107 for catalyzing the formation of the carbon nanotube 104 is arranged between the first conductive layer 101 and the carbon nanotube 104.

The middle layer 102 is divided into two dielectric sublayers 102a, 102b arranged above one another. A third electrically conductive layer 105, the thickness of which is significantly less than the thickness of both dielectric sublayers 102a, 102b, is arranged between the first middle sublayer 102a and the second middle sublayer 102b.

The first electrically conductive layer 101 and the second electrically conductive layer 103 are produced from tantalum nitride, while the third electrically conductive layer 105 is produced from polysilicon, and the dielectric material of the middle layer 102 is silicon dioxide or silicon dioxide which includes potassium ions. In the vertically integrated component 100, the nanostructure is a carbon nanotube 104 and the catalyst material 107 is an alloy of iron, cobalt and nickel. It is known that this combination of materials has an advantageous catalytic action on the formation of a carbon nanotube.

The vertically integrated component 100 is designed as a field-effect transistor, in which component 100 the first end portion 104a of the carbon nanotube 104 serves as a first source/drain region and the second end portion 104b of the carbon nanotube 104 serves as a second source/drain region, with a ring structure 106 composed of an electrically insulating material as gate-insulating region of the field transistor being arranged in the third electrically conductive layer 105, which serves as gate electrode of the field-effect transistor, along the via hole 108 which has been introduced therein.

The vertically integrated component 100 illustrated in FIG. 1A performs the function of a field-effect transistor. The conductivity of the carbon nanotube 104 can be influenced in a characteristic way by applying a suitable electric voltage to the third electrically conductive layer 105, which performs the function of a gate-electrode. An electrical voltage of this type can influence the conductivity of the carbon nanotube 104 in a characteristic way in a spatially sharply defined middle region 104c. The middle region 104c evidently functions as a channel region.

Since, according to one embodiment of the invention, the third electrically conductive layer 105 is made sufficiently thin, when an electric voltage is applied to the third electrically conductive layer 105 a strong electrical field is formed in an adjoining region surrounding the carbon nanotube 104, on account of an electrostatic peak effect. The electrical conductivity of the carbon nanotube 104 in the middle region 104c adjoining the third electrically conductive layer 105 can be controlled very accurately by means of the field effect.

FIG. 1B illustrates an enlarged cross-sectional view, taken on section line A-A from FIG. 1A, of the vertically integrated component 100 illustrated in FIG. 1A.

It can be seen from FIG. 1B that the carbon nanotube 104 is present in the via hole 108. The semiconducting carbon nanotube 104 is decoupled from the third electrically conductive layer 105 by means of the electrically insulating ring structure 106. The intensity of a flow of electric current between the first and second electrically conductive layers 101, 103, which function as source/drain terminals, depends on whether or not an electric voltage has been applied to the gate electrode 105. Therefore, the vertically integrated component 100 performs the function of a field-effect transistor.

The following text describes a method for fabricating the vertically integrated component 100 in accordance with one exemplary embodiment of the invention (not shown in the figures).

First of all, the first electrically conductive layer 101 is formed by the application of titanium nitride, for example using a CVD (chemical vapor deposition) process. In the next substep, a first middle sublayer 102a is formed by deposition of silicon dioxide material. The third electrically conductive layer 105 is formed on the first middle sublayer 102a by the deposition of polysilicon material. This can once again be carried out using a CVD process. The second middle sublayer 102b is formed on the third electrically conductive layer 105 by deposition of silicon dioxide. Both the silicon dioxide material of the first middle sublayer 102a and the silicon dioxide material of the second middle sublayer 102b can be formed using a modified TEOS (tetraethyl orthosilicate) process, such that the middle sublayers 102a, 102b may each include potassium doping atoms.

The middle layer 102, which is formed at least in part from dielectric material, is formed by carrying out the method steps described above. The via hole 108 is introduced into the middle layer 102 using a lithography process and an etching process. In one embodiment, the etching process is selected in such a manner (for example by predetermining the etchant) that the etching operation stops at the electrically conductive layer 101.

The electrically insulating ring structure 106 of silicon dioxide is formed by thermal oxidation of the third electrically conductive layer 105 of polysilicon material. This ring structure 106 is formed with a thickness which corresponds to a typical thickness of a gate oxide layer in a MOSFET, for example 10 nm. In a further method step, the catalyst material 107 composed of iron, cobalt and nickel is deposited in the via hole 108 and on the first electrically conductive layer 101. This can be realized using a vapor deposition, sputtering, electrodeposition or electroless deposition process.

In accordance with the electroless deposition process, a conductive material is deposited autocatalytically on defined surface regions of a layer sequence from a solution that includes the material to be deposited, without the application of an electric current. Then, the carbon nanotube 104 is grown in the via hole 108, with the first end portion 104a being coupled to the first conductive structure 101. A carbon nanotube is formed using a CVD process, in which a methane/hydrogen mixture as carbon source is introduced into the process chamber. This often forms a p-doped carbon nanotube 104.

It is optionally possible for any potassium ions that have been introduced to be expelled from the first middle sublayer 102a and the second middle sublayer 102b by means of a conditioning step, with these potassium ions diffusing into the previously p-doped carbon nanotube 104, where they act as an n-type dopant. As a result, the initially p-doped carbon nanotube 104 is converted into a carbon nanotube 104 of the n-conduction type. Furthermore, the second electrically conductive layer 103 is formed on the middle layer 102 and coupled to the second end portion 104b of the carbon nanotube 104, resulting in the vertically integrated component 100 illustrated in FIG. 1A, FIG. 1B.

The following text, referring to FIG. 2, describes a vertically integrated component 200 configured as a field-effect transistor. The text which follows will, for the most part, describe the differences between the vertically integrated component 200 and the vertically integrated component 100.

The difference between the vertically integrated component 200 and the vertically integrated component 100 is that the electrically insulating ring structure 106 illustrated in FIG. 1A is not shown in the case of the vertically integrated component 200. Instead, the via hole 108 of the vertically integrated component 200 is provided with a continuous electrically insulating boundary coating 201 which performs the functionality of a gate-insulating layer. In other words, the vertically integrated component 200 from FIG. 2 performs the function of a field-effect transistor, with the conductivity of the carbon nanotube 104 being controlled by the application of an electric voltage to the third electrically conductive layer 105. This is effected using the field effect, for which a subregion of the electrically insulating boundary coating 201 surrounding the middle region 104c of the carbon nanotube 104 is crucial.

To fabricate the vertically integrated component 200, as a modification to the fabrication method for fabricating the vertically integrated component 100, prior to the growth of the carbon nanotube 104 in the via hole 108, the via hole 108 is uniformly coated with an electrically insulating material using the CVD process, resulting in the formation of the electrically insulating boundary coating 201. The latter may additionally perform the function of a spacer or a guide for the carbon nanotube 104.

The following text, referring to FIG. 3, describes a component array 300 in accordance with one exemplary embodiment of the invention.

As illustrated in FIG. 3, the component arrangement 300 includes two components arranged above one another, each of which is of similar design to the vertically integrated component 100. The component array 300 evidently includes a field-effect transistor, formed by the vertically integrated component 100, which is arranged above another field-effect transistor.

The additional field-effect transistor, which is arranged below the vertically integrated component 100, has a common electrically conductive layer 301 in common with the vertically integrated component 100, in other words, in the component array 300, the first electrically conductive layer 101 from FIG. 1A and the upper electrically conductive layer of the field-effect transistor below it are in the form of a common layer.

The field-effect transistor which is additionally provided in the component array 300 compared to the vertically integrated component 100 has an additional first electrically conductive layer 303, on which an additional middle layer 302 is formed. This additional middle layer 302 is formed from a first middle sublayer 302a, a second middle sublayer 302b and an additional third electrically conductive layer 305, which is arranged between the middle sublayers 302a, 302b. The first middle sublayer 302a and the second middle sublayer 302b of the additional middle layer 302 are produced from silicon dioxide material. The additional third electrically conductive layer 305 is formed in the same way as the electrically conductive layer 105. Furthermore, an additional electrically insulating ring structure 306 is formed by an additional via hole 308 of the lower region, as seen in FIG. 3, of the component array 300 in a region in which the via hole 308 passes through the additional third electrically conductive layer 305. An additional carbon nanotube 304 has been grown on additional catalyst material 307, and the lower end portion 304a, in accordance with FIG. 3, of this additional carbon nanotube 304 is coupled to the additional catalyst material 307, while its upper end portion 304b is coupled to the common electrically conductive layer 301.

Evidently, the nanostructure in the component array 300 is formed from the carbon nanotube 104 and the additional carbon nanotube 304. Subregions of the nanostructure, namely the carbon nanotube 104, on the one hand, and the additional carbon nanotube 304, on the other hand, have different electrical conductivities. The carbon nanotube 104 of the nanostructure is (as described above) doped with charge carriers of the n-conduction type, and the additional carbon nanotube 304 of the nanostructure is doped with charge carriers of the p-conduction type. The different doping of the carbon nanotubes 104, 304, is based on the carbon nanotube 104 being surrounded by silicon dioxide material 102a, 102b doped with potassium ions, whereas the additional carbon nanotube 304 is surrounded by pure silicon dioxide material 302a, 302b. During conditioning of the layer sequence, the potassium material is expelled from the layers 102a, 102b and diffuses into the carbon nanotube 104, which is n-doped as a result. Doping reversal of this type does not occur in the carbon nanotube 304, since the material 302a, 302b surrounding it does not contain any potassium dopant.

As a result, the additional carbon nanotube 304 remains in the p-doped state in which it was obtained during the CVD growth. In other words, the upper field-effect transistor, as seen in FIG. 3, of the component array 300 performs the function of an n-type MOSFET, whereas the lower field-effect transistor, as seen in FIG. 3, of the component array 300 performs the function of a p-type MOSFET.

The component array 300 is produced by first of all forming the lower field-effect transistor, as seen in FIG. 3, in a similar manner to what has been described above with reference to FIG. 1A. As a modification to the fabrication method used to fabricate the vertically integrated component 100 illustrated in FIG. 1A, however, during production of the component array 300 illustrated in FIG. 3 the first middle sublayer 302a and the second middle sublayer 302b are in each case produced from pure silicon dioxide without any potassium doping atoms. This creates the lower field-effect transistor of the component array 300, including the additional carbon nanotube 304 of the p-conduction type.

Then, a vertically integrated component 100, as illustrated in FIG. 1A, is fabricated on this layer sequence. In this context, it should be noted that the common electrically conductive layer 301 forms both the upper source/drain terminal, as seen in FIG. 3, of the lower field-effect transistor, as seen in FIG. 3, and the lower source/drain terminal, as seen in FIG. 3, of the upper field-effect transistor, as seen in FIG. 3. In accordance with the exemplary embodiment described, both the first middle sublayer 102a and the second middle sublayer 102b are produced from silicon dioxide material doped with potassium material, and consequently the carbon nanotube 104 obtained as a p-doped carbon nanotube in the CVD production process is n-doped after the conditioning operation described above.

In one embodiment, the component array 300 produces an n-type MOS transistor on a p-type MOS transistor, and therefore the component array 300 can be used as a CMOS component. In CMOS (complementary metal oxide semiconductor) technology, alternatively operating n-channel and p-channel MOSFETs are used as switches. CMOS components are used in many large-scale integrated circuits, for example many modern microprocessors are constructed using this technology.

The following text, referring to FIG. 4A, FIG. 4B, describes a component array 400 in accordance with an alternative embodiment of the invention.

In the component array 400, a p-type MOS field-effect transistor 401, formed by the lower layer sequence illustrated in FIG. 4A, and an n-type MOS field transistor 402, formed by the upper layer sequence, illustrated in FIG. 4A, of the component array 400, are connected to one another as an inverter circuit.

The following text describes the structure and functionality of this CMOS inverter. As illustrated in FIG. 4A, the electrical ground potential $V_{ss}$ 403 is applied to the second electrically conductive layer 103 of the n-type MOS field-effect transistor 402. Furthermore, the electrical potential of a supply voltage $V_{dd}$ 404 is applied to the additional first electrically conductive layer 303 of the p-type MOS field-effect transistor 401. Moreover, the third electrically conductive layer 105 and the additional third electrically conductive layer 305 are coupled to an input 405 of the CMOS inverter. The common electrically conductive layer 301 is coupled to an output 406 of the CMOS inverter.

FIG. 4B illustrates an equivalent circuit diagram 410 of the component array 400, which component array 400 is connected as a CMOS inverter. The input 405 is coupled to the gate region of the p-type MOS field-effect transistor 401 and of the n-type MOS field-effect transistor 402, that is, to the parts of the component array 400 which function as respective gate electrodes, namely to the third electrically conductive layer 105 and to the additional third electrically conductive layer 305. The second electrically conductive layer 103 of the n-type MOS field-effect transistor 402 serves as the first source/drain terminal of the n-type MOS field-effect transistor 402, and therefore the electrical ground potential $V_{ss}$ 403 is applied to the first electrically conductive layer 103. Furthermore a second source/drain terminal of the n-type MOS field-effect transistor 402 and a first source/drain terminal of the p-type MOS field-effect transistor 401 are jointly formed as a common electrically conductive layer 301 and coupled to the output 406 of the component array 401 connected as a CMOS inverter. A second source/drain terminal of the p-type MOS field-effect transistor 401 is formed by the additional electrically conductive layer 303, to which the electrical potential of the supply voltage $V_{dd}$ 404 is applied.

If an electrical potential with a logic value "1" is applied to the input 405, the n-type MOS field-effect transistor 402 is conducting whereas the p-type MOS field-effect transistor 402 is nonconducting. Therefore, the output 406 is coupled to the electrical ground potential $V_{ss}$ 403. Therefore, in this case a signal with a logic value "0" is present at the output 406. In another case, in which an electrical signal with a logic value "0" is applied to the input 405, the n-type MOS field-effect transistor 402 is nonconducting, whereas the p-type MOS field-effect transistor 401 is conducting. Therefore, the output 406 is coupled to the electrical potential of the supply voltage $V_{dd}$ 404, so that an electrical signal with a logic value "1" is present at the output 406. To summarize, it can be stated that in accordance with the functionality of the CMOS inverter, in each case the signal which is the inverse of the signal provided at the input 405 is present at the output 406.

The following text, referring to FIG. 5, describes a vertically integrated component 500 in accordance with an alternative embodiment of the invention.

One difference between the vertically integrated component 500 and the vertically integrated component 100 is that the middle layer is of different structure. The middle layer 501 of the vertically integrated component 500 in addition to the first middle sublayer 102a of potassium-doped silicon dioxide, the second middle sublayer 102b of potassium-doped silicon dioxide, the third electrically conductive layer 105 of polysilicon and the electrically insulating ring structure 106, also has a third middle sublayer 501a of silicon nitride, which is arranged between the third electrically conductive layer 105 and a fourth electrically conductive layer 502. An additional electrically insulating ring structure 503 is arranged in a boundary region between the via hole 108 and the fourth electrically conductive layer 502. The fourth electrically conductive layer 502 is formed from polysilicon material, and the fourth electrically insulating ring structure 503 is produced from silicon dioxide material.

The vertically integrated component 500 represents a field-effect transistor with two gate electrodes 105, 502. A field-effect transistor having a plurality of gate terminals of this type may be advantageous for certain applications in order to influence the electrical conductivity of the carbon nanotube 104 at different subregions or at a plurality of subregions simultaneously.

One embodiment of the invention provides a vertically integrated component which can optionally be used as a field-effect transistor, a CMOS component, an inverter and a field-effect transistor having a plurality of gate electrodes. A wide range of more complex circuits can be constructed or formed from these basic components, for example logic gates and further complex circuit arrangements. On account of the vertical orientation, the individual components of the invention can be formed above one another in any desired way, and may furthermore be formed next to one another.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertically integrated field-effect transistor comprising:
a first electrically conductive layer;
a middle layer, formed partially from dielectric material, on the first electrically conductive layer;
a second electrically conductive layer on the middle layer; and
a nanostructure grown up in a via hole from the bottom of the via hole introduced into the middle layer such that the grown nanostructure does not contact adjacent sidewalls of the via hole, the nanostructure further comprising a first end portion that is coupled to the first electrically conductive layer and a second end portion that is coupled to the second electrically conductive layer;
wherein the first end portion of the nanostructure forms a first source/drain region and the second end portion of the nanostructure forms a second source/drain region of the field-effect transistor;
wherein the middle layer, between two adjacent dielectric sublayers, has a third electrically conductive layer, the thickness of which is less than the thickness of at least one of the dielectric sublayers;
wherein a thin ring structure formed by oxidizing the third electrically conductive layer resulting in an oxidized layer as the gate-insulating region of the field-effect transistor arranged in the third electrically conductive layer, which forms the gate electrode of the field-effect transistor, along the via hole that has been introduced therein.

2. The field-effect transistor of claim 1, wherein catalyst material for catalyzing the formation of the nanostructure is arranged between the first conductive layer and the nanostructure.

3. The field-effect transistor of claim 2, wherein the third electrically conductive layer surrounds the nanostructure in a region around the first or second end portion.

4. The field-effect transistor of claim 3, wherein the thickness of the third electrically conductive layer is less than the thickness of both dielectric sub layers.

5. The field-effect transistor of claim 1, wherein the middle layer has an additional electrically conductive layer, which at least one additional electrically conductive layer serves as an additional gate electrode of the field-effect transistor, with an additional ring structure formed from an electrically insulating material as an additional gate-insulating region of the field-effect transistor being arranged along the via hole that has been introduced in the additional electrically conductive layer.

6. The field-effect transistor of claim 1, having an additional field-effect transistor above the field-effect transistor.

7. The field-effect transistor of claim 6, wherein the field-effect transistor and the additional field-effect transistor are connected to one another as an inverter circuit.

8. The field-effect transistor of claim 1, wherein the first and second electrically conductive layer includes one of a group comprising tantalum, tantalum nitride, titanium, molybdenum, aluminum, titanium nitride, and a ferromagnetic material.

9. The field-effect transistor of claims 5, wherein the third and additional electrically conductive layer comprises one of a group comprising polysilicon, tantalum, titanium, niobium, and aluminum.

10. The field-effect transistor of claim 1, wherein the dielectric material of the middle layer is one or a combination of the materials in a group comprising silicon dioxide, silicon nitride, and silicon dioxide doped with potassium ions.

11. The field-effect transistor of claim 1, wherein the nanostructure includes one of a group comprising a nanotube, a bundle of nanotubes, and a nanorod.

12. The field-effect transistor of claim 11, wherein the nanorod includes one of a group comprising silicon, germanium, indium phosphide, gallium nitride, gallium arsenide, zirconium oxide and a metal.

13. The field-effect transistor of claim 11, wherein the nanotube is one of a group comprising a carbon nanotube, a carbon-boron nanotube, a carbon-nitrogen nanotube, a tungsten sulfide nanotube, and a chalcogenide nanotube.

14. The field-effect transistor of claim 2, wherein the nanostructure is a carbon nanotube, and wherein the catalyst material is one of a group comprising iron, cobalt, and nickel.

15. The field-effect transistor of claim 2, wherein the nanostructure is a gallium arsenide nanorod, and wherein the catalyst material includes gold.

16. The field-effect transistor of claim 1, formed exclusively from dielectric material, metallic material and the material of the nanostructure.

17. The field-effect transistor of claim 1, formed on a substrate made from polycrystalline or amorphous material.

18. A field-effect transistor comprising:
a first conductive layer;
a middle layer on the first conductive layer, the middle layer having a via hole therein, and having a third conductive layer between two adjacent dielectric sublayers, the third electrically conductive layer forming the gate electrode of the field-effect transistor;
a second conductive layer on the middle layer;
a nanostructure grown up in a via hole from the bottom of the via hole such that the grown nanostructure does not contact adjacent sidewalls of the via hole and having a first source/drain region of the field-effect transistor that is coupled to the first conductive layer and a second source/drain region of the field-effect transistor that is coupled to the second conductive layer, and
thin ring-shaped means within the third electrically conductive layer of the middle layer along the via hole formed by oxidizing the third electrically conductive layer, for providing a gate-insulating region of the field-effect transistor.

19. The field-effect transistor of claim 18, wherein the thickness of the third conductive layer is less than the thickness of the dielectric sublayers.

20. A vertically integrated field-effect transistor comprising:
a first electrically conductive layer;
a middle layer, formed partially from dielectric material, on the first electrically conductive layer;
a second electrically conductive layer on the middle layer; and
a nanostructure grown up in a via hole from the bottom of the via hole introduced into the middle layer such that the grown nanostructure does not contact adjacent sidewalls of the via hole, the nanostructure further comprising a first end portion that is coupled to the first electrically conductive layer and a second end portion that is coupled to the second electrically conductive layer;

wherein the first end portion of the nanostructure forms a first source/drain region and the second end portion of the nanostructure forms a second source/drain region of the field-effect transistor;

wherein the middle layer, between two adjacent dielectric sublayers, has a third electrically conductive layer, the thickness of which is less than the thickness of at least one of the dielectric sublayers;

wherein a thin ring structure formed by oxidizing the third electrically conductive layer as gate-insulating region of the field-effect transistor is arranged in the third electrically conductive layer, which forms the gate electrode of the field-effect transistor, along the via hole that has been introduced therein, wherein the middle layer has an additional electrically conductive layer, which at least one additional electrically conductive layer serves as an additional gate electrode of the field-effect transistor, with an additional ring structure formed from an electrically insulating material as an additional gate-insulating region of the field-effect transistor being arranged along the via hole that has been introduced in the additional electrically conductive layer.

* * * * *